(12) United States Patent
Camacho et al.

(10) Patent No.: US 9,659,897 B1
(45) Date of Patent: May 23, 2017

(54) INTEGRATED CIRCUIT PACKAGING SYSTEM WITH INTERPOSER STRUCTURE AND METHOD OF MANUFACTURE THEREOF

(71) Applicant: STATS ChipPAC Pte. Ltd., Singapore (SG)

(72) Inventors: Zigmund Ramirez Camacho, Singapore (SG); Emmanuel Espiritu, Singapore (SG); Bartholomew Liao Chung Foh, Singapore (SG); Dao Nguyen Phu Cuong, Singapore (SG); Jeffrey David Punzalan, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/167,895

(22) Filed: May 27, 2016

Related U.S. Application Data

(62) Division of application No. 14/318,061, filed on Jun. 27, 2014, now Pat. No. 9,355,983.

(51) Int. Cl.
| | |
|---|---|
| *H01L 23/22* | (2006.01) |
| *H01L 23/24* | (2006.01) |
| *H01L 23/00* | (2006.01) |
| *H01L 23/31* | (2006.01) |
| *H01L 23/522* | (2006.01) |

(52) U.S. Cl.
CPC .......... *H01L 24/25* (2013.01); *H01L 23/3114* (2013.01); *H01L 23/5226* (2013.01); *H01L 23/562* (2013.01); *H01L 24/17* (2013.01); *H01L 2224/1701* (2013.01); *H01L 2224/2501* (2013.01); *H01L 2224/2505* (2013.01)

(58) Field of Classification Search
USPC ........ 257/687, 713, 787; 438/126, 612, 613, 438/667
See application file for complete search history.

(56) References Cited

U.S. PATENT DOCUMENTS

| | | | |
|---|---|---|---|
| 7,429,510 B2 * | 9/2008 | Das | H05K 1/162 361/766 |
| 8,441,133 B2 | 5/2013 | Komatsu et al. | |
| 9,355,983 B1 | 5/2016 | Camacho et al. | |
| 2007/0010064 A1 * | 1/2007 | Das | H05K 1/162 438/393 |
| 2011/0084372 A1 | 4/2011 | Su et al. | |
| 2013/0026657 A1 | 1/2013 | Hsiao et al. | |

(Continued)

FOREIGN PATENT DOCUMENTS

KR 10-2010-0110454 10/2010

OTHER PUBLICATIONS

U.S. Appl. No. 14/318,061, Non-Final Office Action dated Jul. 14, 2014.

(Continued)

*Primary Examiner* — Telly Green
(74) *Attorney, Agent, or Firm* — Wong & Rees LLP; Kirk D. Wong

(57) ABSTRACT

A system and a method of manufacture thereof of integrated circuit packaging system, including: a pillar; a conductive buildup attached to the pillar; and a molded body encapsulating the conductive buildup, the pillar extending out of the molded body.

14 Claims, 6 Drawing Sheets

(56) References Cited

U.S. PATENT DOCUMENTS

2013/0181359 A1* 7/2013 Wu .................... H01L 25/105
 257/777
2014/0077394 A1* 3/2014 Chang ................ H01L 23/4334
 257/782

OTHER PUBLICATIONS

U.S. Appl. No. 14/318,061, Non-Final Office Action dated May 21, 2015.
U.S. Appl. No. 14/318,061, Non-Final Office Action dated Sep. 11, 2015.

* cited by examiner

INTEGRATED CIRCUIT PACKAGING SYSTEM WITH INTERPOSER STRUCTURE AND METHOD OF MANUFACTURE THEREOF

CROSS-REFERENCE TO RELATED APPLICATION(S)

This is a divisional of co-pending U.S. patent application Ser. No. 14/318,061 filed Jun. 27, 2014, and the entire subject matter thereof is hereby incorporated herein for all purposes by reference thereto. Applicant hereby rescinds any disclaimer of claim scope in the parent application(s) or the prosecution history thereof and advise the USPTO that the claims in this application may be broader than any claim in the parent application(s).

TECHNICAL FIELD

The present invention relates generally to an integrated circuit packaging system, and more particularly to a system having an interposer structure.

BACKGROUND

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner, which create problems with arranging devices on boards and other circuits. The packaging configurations that house and protect IC require them to be made smaller, thinner, and sturdier as well.

Thus, a need still remains for an integrated circuit packaging system with interposer structure and method of manufacture thereof providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DETAILED DESCRIPTION

General Overview

Figure 1:
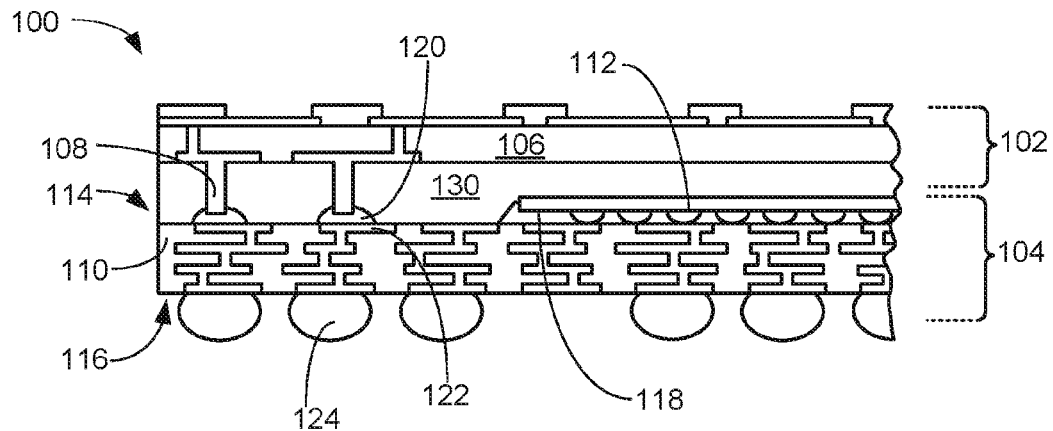
FIG. 1 is a partial cross-sectional view of an integrated circuit packaging system along a line 1-1 of FIG. 2 in a first embodiment of the present invention.

The present invention provides a method of manufacture of an integrated circuit packaging system, including: providing a carrier; forming a hole into the carrier; forming a pillar in the hole of the carrier; forming a conductive buildup over the pillar; forming a molded body over the carrier and the support pillar, the molded body for encapsulating the conductive buildup; and removing the carrier for exposing the pillar.

The present invention provides an integrated circuit packaging system, including: a pillar; a conductive buildup attached to the pillar; and a molded body encapsulating the conductive buildup, the pillar extending out of the molded body.

Certain embodiments of the invention have other aspects in addition to or in place of those mentioned or obvious from the above. The aspects will become apparent to those skilled in the art from a reading of the following detailed description when taken with reference to the accompanying drawings.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 2:
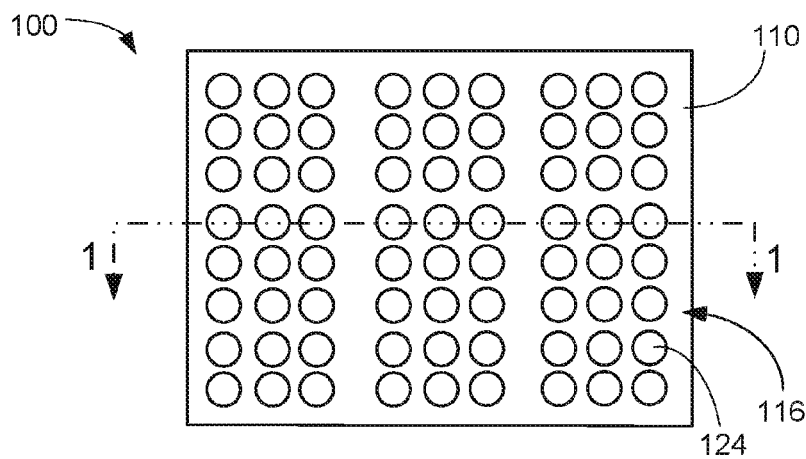
FIG. 2 is a bottom view of the integrated circuit packaging system.

Referring now to FIG. 1, therein is shown a partial cross-sectional view of an integrated circuit packaging system 100 along a line 1-1 of FIG. 2 in a first embodiment of the present invention. The integrated circuit packaging system 100 can include an interposer assembly 102 and a base assembly 104. The interposer assembly 102 can be mounted over the base assembly 104.

The interposer assembly 102 is an interposer including a molded body 106 and a support pillar 108. The interposer assembly 102 can be mounted over the base assembly 104. The interposer assembly 102 can be fabricated as a single discrete structure before being mounted on the base assembly 104. The interposer assembly 102 will be explained in further detail below.

The base assembly 104 can include a base substrate 110 and an integrated circuit device 112. The base substrate 110 can provide support and connectivity for components and devices. For example, the base substrate 110 can include a printed circuit board (PCB), a carrier substrate, a semiconductor substrate with electrical interconnections, or a ceramic substrate as examples.

The base substrate 110 includes conductive layers and conductive traces embedded therein. The base substrate 110 can include a component side 114 for mounting components, devices, and packages. The base substrate 110 can also include a system side 116, which is a side opposite to the component side 114, for connecting to a next system level (not shown). The base substrate 110 can include bonding pads on the component side 114 and the system side 116.

The integrated circuit device 112 is defined as a semiconductor device having one or more integrated transistors for implementing active circuitry. For example, the integrated circuit device 112 can include interconnects, passive devices, or a combination thereof. For example, a flip-chip or a wafer scale chip can be representative of the integrated circuit device 112. The integrated circuit device 112 is preferably shown in a flip-chip configuration. However, the integrated circuit device 112 can also be in a wire-bonded configuration. The integrated circuit device 112 can be mounted to the component side 114 of the base substrate 110.

An underfill 118 can be between the integrated circuit device 112 and the base substrate 110. The underfill 118 is a molded cover for providing drop, mechanical, and environmental protection for integrated circuit devices and chips.

The integrated circuit packaging system 100 can include a solder structure 120. The solder structure 120 can include a solder bump, solder pillar, solder ball, and a conductive bump as examples. The solder structure 120 can be attached to interconnection pads 122 on the component side 114 of the base substrate 110. The base substrate 110 can include the interconnection pads 122 on the component side 114 and the system side 116.

The solder structure 120 can have a wide diameter for supporting the attachment of the support pillar 108 to the base substrate 110 and for facilitating alignment and electrical connection between the support pillar 108 with the interconnection pads 122. Further, it has been found that the solder structure 120 provides increased interlocking between the base substrate 110 and the interposer assembly 102, which decreases separation.

The solder structure 120 can have a vertical height greater than 15 micrometers (μm). For example, the solder structure 120 can partially envelope the support pillar 108 with a coverage or bond line of 15-25 μm when the support pillar 108 is attached to the solder structure 120. The diameter (horizontal dimension) of the solder structure 120 can include a diameter greater than the interconnection pads 122 to facilitate interconnection between the interconnection pads 122 and the support pillar 108.

The integrated circuit packaging system 100 can include a system interconnect 124. The system interconnect 124 is defined as an electrical connector providing direct electrical and mechanical connection to the next system level (not shown). As an example, the system interconnect 124 can be a solder ball, a solder post, or a conductive bump. The system interconnect 124 can be attached to the base substrate 110. The system interconnect 124 can be used to attach the base assembly 104 to a next level system.

The support pillar 108 can be attached to the solder structure 120. The support pillar 108 is a conductive structure extending from the molded body 106. The support pillar 108 can include a pillar or post and can include conductive material such as copper. The support pillar 108 can include multiple functions for the interposer assembly 102. The support pillar 108 can provide a direct vertical electrical connection between the base substrate 110 and conductive layers within the molded body 106.

Further, it has also been found that the support pillar 108 can provide structural support for suspending the molded body 106 over the base assembly 104. The support pillar 108 can suspend the interposer assembly 102 above the base assembly 104 prior to package molding. The support pillar 108 can have a height of over 400 μm from one end to the other end attached to the molded body 106. For example, height can be measured in a vertical direction such as from the base assembly 104 to the interposer assembly 102. The diameter of the support pillar 108 can include a range of 50-300 μm for providing structural support for the interposer assembly 102.

The interposer assembly 102 can also include the molded body 106 over the support pillar 108. The molded body 106 can include encapsulation material for supporting traces and conductive layers embedded therein. The molded body 106 can include an epoxy molding compound (EMC), polyimide compound, polyamide compound, polyamide-imide compound, a wire-in-film (WIF) encapsulation material, or a combination thereof.

The support pillar 108 extends from the molded body 106. The support pillar 108 and the molded body 106 form a discrete pre-fabricated structure that can be mounted as a single component on the base assembly 104.

The integrated circuit device 112 can include a base encapsulation 130 between the interposer assembly 102 and the base assembly 104. The base encapsulation 130 can include an encapsulation material such as an epoxy molding compound (EMC), polyimide compound, polyamide compound, polyamide-imide compound, a wire-in-film (WIF) encapsulation material, or a combination thereof.

The base encapsulation 130 can surround the support pillar 108 for providing additional structural support. A bottom surface of the molded body 106 can be coplanar with a top surface of the base encapsulation 130.

It has been discovered that the molded body 106 of the interposer assembly 102 provides structural rigidity to the integrated circuit packaging system 100. It has been found that the molded body 106 can be a low cost alternative to the use of laminates and dielectric materials used for interposers. The encapsulation material of the molded body 106 is more resistant to warpage than other materials used for interposers such as a dielectric material.

It has also been discovered that the interposer assembly 102, including the support pillar 108 and the molded body 106, can be fabricated as a single discrete structure instead of being formed piece by piece on the base assembly 104. The support pillar 108 can be built-in when forming the interposer assembly 102 as a single discrete structure. The single discrete unit construction of the interposer assembly 102 increases yield and reduces manufacturing time because the interposer assembly 102 can be quickly placed on any compatible bottom substrate, system, or package.

Further, it has been found that the support pillar 108 and the solder structure 120 replace the need for thermal compression bonding (TCB) and large solder balls when attaching the traces of the interposer to the traces of the base substrate 110. The support pillar 108 and the solder structure 120 increase the reliability of the electrical connection because the solder structure 120 includes a diameter that is wide enough to prevent misalignment of interconnection during attachment. It has also been found that the support pillar 108 having a height equal to or over 400 μm provides a high profile interposer for mounting more components underneath the interposer assembly 102 in a package.

Referring now to FIG. 2, therein is shown a bottom view of the integrated circuit packaging system 100. The view can include the system side 116 of the base substrate 110. The system interconnect 124 can be configured in an array along the system side 116.

Figure 3:
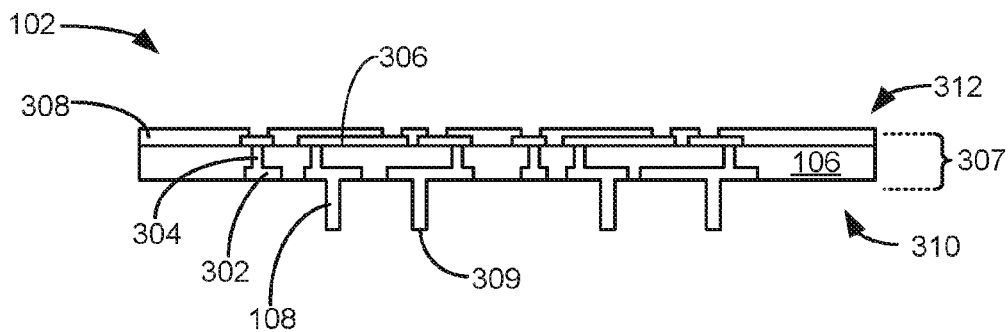
FIG. 3 is an extended detailed view of the interposer assembly of FIG. 1.

Referring now to FIG. 3, therein is shown an extended detailed view of the interposer assembly 102 of FIG. 1. The detailed view can show the interposer assembly 102 before attachment to the base assembly 104 of FIG. 1.

The interposer assembly 102 can include the support pillar 108 and the molded body 106 as described in FIG. 1.

The interposer assembly 102 can also include a first trace layer 302, a via 304, a second trace layer 306, and a solder mask layer 308. The molded body 106 can include a body first side 310 and a body second side 312 opposite to the body first side 310.

The first trace layer 302 is a conductive layer embedded within the molded body 106. The first trace layer 302 is in direct contact with the support pillar 108. The first trace layer 302 is partially exposed from the body first side 310 of the molded body 106. The first trace layer 302 is also coplanar with the body first side 310.

The via 304 is directly attached over the first trace layer 302. The via 304 is a conductive structure for providing a vertical electrical connection. The via 304 is embedded in the molded body 106 and partially exposed from the molded body 106 at the body second side 312.

The second trace layer 306 is a conductive layer formed over the body second side 312 and over the via 304. The second trace layer 306 is in direct contact with the via 304. The second trace layer 306 is not embedded within the molded body 106 but is formed over the body second side 312.

The three structures of the first trace layer 302, the via 304, and the second trace layer 306 can form a conductive buildup 307. The conductive buildup 307 is a grouping of the conductive structures associated with the molded body 106. The conductive buildup 307 includes the via 304, the first trace layer 302, and the second trace layer 306. The components of the conductive buildup 307 can include a conductive material such as copper.

The solder mask layer 308 is formed over the second trace layer 306 and the body second side 312. The solder mask layer 308 can include a dielectric material and openings for exposing portions of the second trace layer 306. The solder mask layer 308 and the second trace layer 306 can form recessed bond pads at the openings in the solder mask layer 308.

The support pillar 108 can include a lateral sidewall and a pillar base 309. The pillar base 309 is the end of the support pillar 108 that is opposite from the first trace layer 302. The pillar base 309 can be attached to the solder structure 120 of FIG. 1.

It has been discovered that the interposer assembly 102 with the support pillar 108 provides built-in connectors for modular package-on-package designs. It has been found that the build-in pillars provide rigid and high profile conductive structures for supporting the interposer assembly 102. The high profile can include a height equal to or greater than 400 μm from the pillar base 309 to the first trace layer 302.

Figure 4:
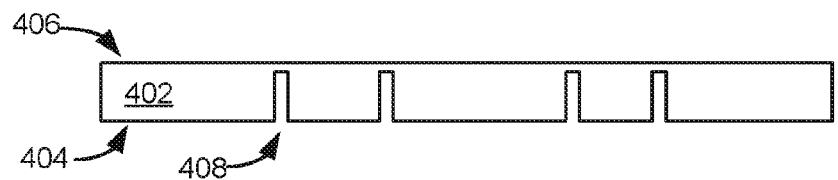
FIG. 4 is the integrated circuit packaging system of FIG. 1 in a carrier-preparation phase of manufacture.

Referring now to FIG. 4, therein is shown the integrated circuit packaging system 100 of FIG. 1 in a carrier-preparation phase of manufacture. A carrier 402 is provided. The carrier 402 can include SPCC grade steel. It has been found that SPCC grade steel can be etched without damaging cooper components and simplifies process control over the use of copper carriers. The carrier 402 can include a carrier first side 404 and a carrier second side 406 opposite to the carrier first side 404.

A hole 408 can be formed into the carrier 402. The hole 408 can be formed using laser ablation or mechanical drilling. The hole 408 can be a blind hole or the hole 408 can be a through-hole that passes completely through the carrier 402. For illustrative purposes, the hole 408 is shown as a blind hole, which does not pass completely through the carrier 402.

It has been discovered that through-hole drilling of the carrier 402 provides for consistent depth in forming pillars and vias using the carrier 402. Pillars formed from the hole 408 can be defined by the thickness of the carrier 402, which can provide for a consistent and uniform manufacturing process.

The carrier 402 can have a width or thickness equal to or greater than 400 μm. It has been discovered that the width of the carrier 402 can be used to determine the height of the support pillar 108 of FIG. 1. The depth of the hole 408 in the carrier 402 can determine the height of the support pillar 108. By forming consistent holes in the carrier 402, the support pillar 108 formed by the holes can include a uniform height with known dimensions.

Further, it has been found that the width or diameter of the hole 408 can be used to determine the diameter of the support pillar 108. The ability to drill multiple holes into the carrier 402 provides the benefit of creating pillars with fine pitch after plating of the holes. Further, it has been found that forming the holes in the carrier 402 allow the height and the diameter of the support pillar 108 to be determined in a single manufacturing step instead of separate steps to form these dimensions.

Figure 5:
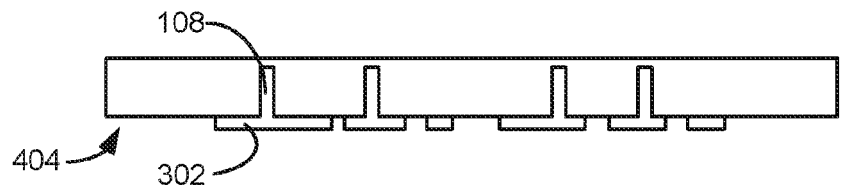
FIG. 5 is the structure of FIG. 4 in a first plating phase of manufacture.

Referring now to FIG. 5, therein is shown the structure of FIG. 4 in a first plating phase of manufacture. The first trace layer 302 and the support pillar 108 can be formed through a plating method.

It has been found that the first trace layer 302 and the support pillar 108 can be formed on the carrier first side 404 in a single manufacturing step for reducing manufacturing steps and increasing yield. The first trace layer 302 and the support pillar 108 can be formed using a conductor formation process including chemical vapor deposition (CVD), a photo resist method, plating, sputtering, physical vapor deposition (PVD), electrolytic plating, and electroless plating processes as examples. The plating within the hole 408 of FIG. 4 forms the support pillar 108. The first trace layer 302 is formed on the carrier first side 404.

Figure 6:
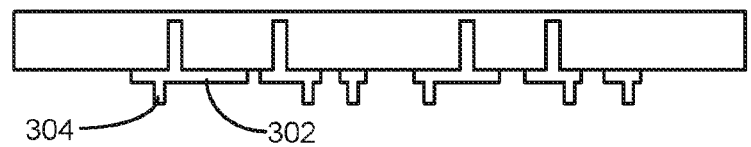
FIG. 6 is the structure of FIG. 5 in a via-formation phase of manufacture.

Referring now to FIG. 6, therein is shown the structure of FIG. 5 in a via-formation phase of manufacture. The via 304 can be formed on the first trace layer 302. The via 304 can extend vertically beyond the first trace layer 302, which can provide a vertical electrical connection.

The via 304 can be formed using a conductor formation process including chemical vapor deposition (CVD), a photo resist method, plating, sputtering, physical vapor deposition (PVD), electrolytic plating, and electroless plating processes as examples.

Figure 7:
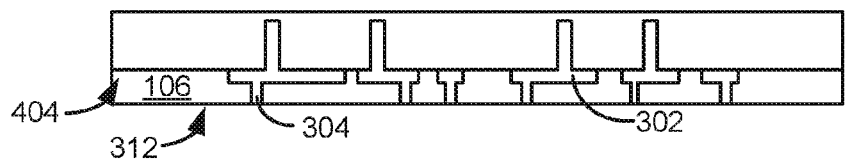
FIG. 7 is the structure of FIG. 6 in a molding phase of manufacture.

Referring now to FIG. 7, therein is shown the structure of FIG. 6 in a molding phase of manufacture. The molded body 106 can be formed over the carrier first side 404, the first trace layer 302, and the via 304.

The molded body 106 can be formed using film-assist molding, carrier-assist molding, transfer molding, injection molding, or a combination thereof. The via 304 can be exposed from the body second side 312.

Figure 8:
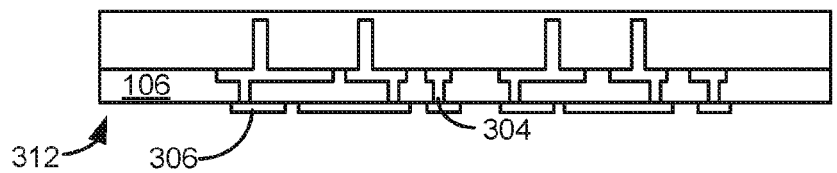
FIG. 8 is the structure of FIG. 7 in a second plating phase of manufacture.

Referring now to FIG. 8, therein is shown the structure of FIG. 7 in a second plating phase of manufacture. The second trace layer 306 can be formed on the body second side 312 of the molded body 106. The second trace layer 306 is in direct contact with a portion of the via 304 exposed from the molded body 106.

The second trace layer 306 can be formed using a conductor formation process including chemical vapor deposition (CVD), a photo resist method, plating, sputtering, physical vapor deposition (PVD), electrolytic plating, and electroless plating processes as examples. The second trace layer 306 is in direct contact with and coplanar with the body second side 312 of the molded body 106.

Figure 9:
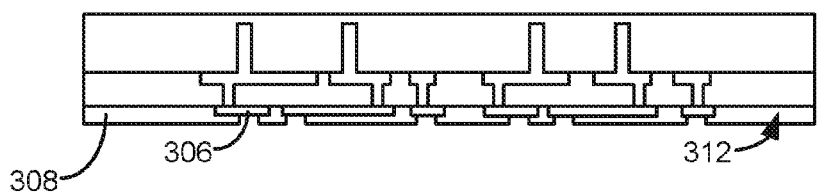
FIG. 9 is the structure of FIG. 8 in a mask-formation phase of manufacture.

Referring now to FIG. 9, therein is shown the structure of FIG. 8 in a mask-formation phase of manufacture. The solder mask layer 308 is formed over the body second side 312 and the second trace layer 306. It has been found that the second trace layer 306 forms bond pads for the interposer assembly 102 of FIG. 1 through openings in the solder mask layer 308.

Figure 10:
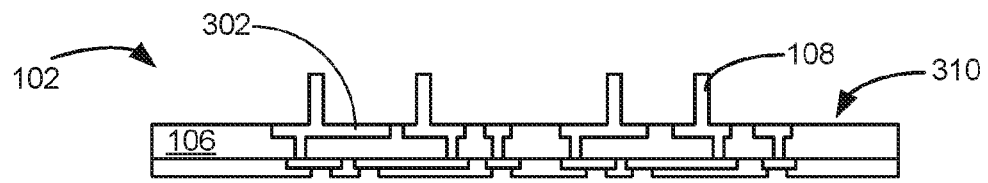
FIG. 10 is the structure of FIG. 9 in a carrier-removal phase of manufacture.

Referring now to FIG. 10, therein is shown the structure of FIG. 9 in a carrier-removal phase of manufacture. An etching method, such as chemical etching, can be used to remove the carrier 402 of FIG. 4. The removal of the carrier 402 forms the interposer assembly 102 as a discrete structure that can be mounted on other components and substrates. The interposer assembly 102 with the support pillar 108 can be inverted and mounted on a substrate for serving as an interposer.

The etching method exposes the support pillar 108 from the carrier 402, which allows the support pillar 108 to be mounted on other components, assemblies, substrates, or systems. The etching method also exposes the first trace layer 302 and the body first side 310 of the molded body 106.

The etching method can completely remove the carrier 402 with the support pillar 108 and the first trace layer 302 including a rough surface characteristic of the etching process. It has been found that the rough surface can include very small dimples, small dents, small pits or small crevices that do not affect the structural strength of the support pillar 108 but allow the carrier 402 to be completely removed.

It has been found that the use of the carrier 402 for forming pillars, such as the support pillar 108, can replace the need for thick dry film resist (DFR) methods in pillar formation. The carrier 402 provides an advantage over other DFR methods because the carrier 402 can be used to form the support pillar 108 with a height over 400 μm instead of DFR methods that are limited to about 80 μm. The carrier 402 can be used to create consistent, fine pitched, and high profile conductive pillars without the reliance of DFR layers.

Figure 11:
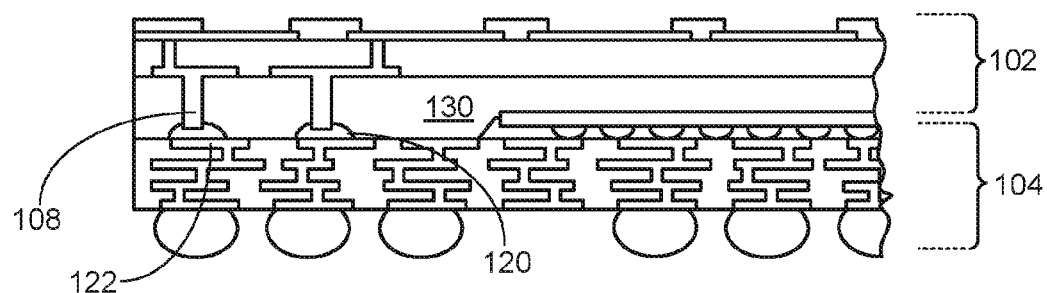
FIG. 11 is a partial view of the interposer assembly of FIG. 10 mounted to the base assembly.

Referring now to FIG. 11, therein is shown a partial view of the interposer assembly 102 of FIG. 10 mounted to the base assembly 104. The interposer assembly 102 can be attached to the base assembly 104.

The support pillar 108 can be connected and aligned to the interconnection pads 122 by the solder structure 120. Transfer or injection molding can be used to form the base encapsulation 130 between the interposer assembly 102 and the base substrate 110.

Figure 12:
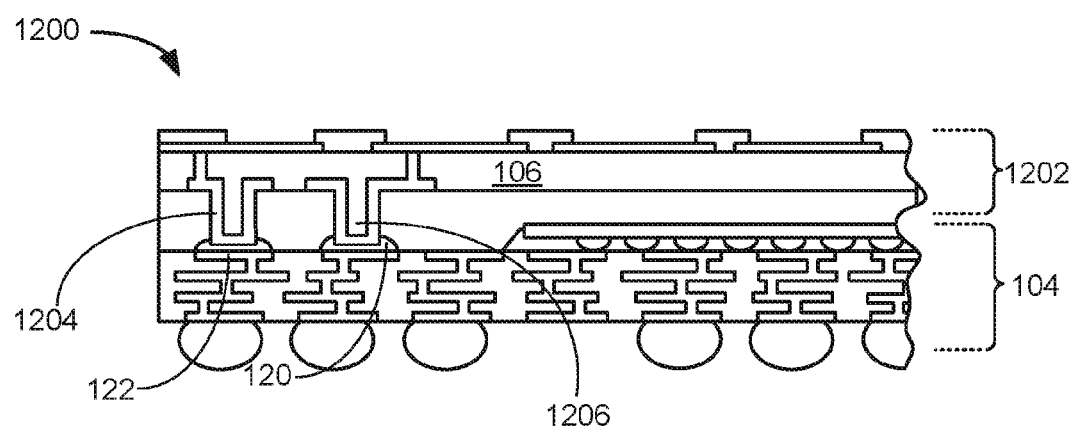
FIG. 12 is a partial cross-sectional view of an integrated circuit packaging system along a line 1-1 of FIG. 2 in a second embodiment of the present invention.

Referring now to FIG. 12, therein is shown a partial cross-sectional view of an integrated circuit packaging system 1200 along a line 1-1 of FIG. 2 in a second embodiment of the present invention. The integrated circuit packaging system 1200 can include an interposer assembly 1202 and the base assembly 104. The interposer assembly 1202 can include the same components as the interposer assembly 102 of FIG. 1, except that the interposer assembly 1202 includes a wide pillar 1204.

The wide pillar 1204 can include a wider diameter than the support pillar 108 of FIG. 1. For example, the wide pillar 1204 can include a diameter of 250 μm to 350 μm between the lateral sidewalls of the wide pillar 1204.

The wide pillar 1204 can include a pillar core 1206 between the lateral sidewalls of the wide pillar 1204. The pillar core 1206 can be an inner portion of the wide pillar 1204 and is filled with the same material as the molded body 106. The interposer assembly 1202 can be mounted over the base assembly 104.

It has been discovered that the wide pillar 1204 and the pillar core 1206 provided a pillar with increased rigidity and structural strength. The wide pillar 1204 having the pillar core 1206 can support more weight and is less prone to warping and collapse during attachment.

It has been discovered that the wide pillar 1204 having a diameter of 250 µm to 350 µm increases surface area when bonding to other interconnect structures. The increased size of the wide pillar 1204 facilitates alignment with the interconnection pads 122 so less precision is needed when mounting the interposer assembly 102 onto the base assembly 104. The facilitation of alignment increases manufacturing yield, while ensuring a reliable electrical connection between both the interposer assembly 1202 and the base assembly 104.

It has been discovered that the molded body 106 of the interposer assembly 102 provides structural rigidity to the integrated circuit packaging system 100. It has been found that the molded body 106 can be a low cost alternative to the use of laminates and dielectric materials used for interposers. The encapsulation material of the molded body 106 is more resistant to warpage than other materials used for interposers such as dielectric material.

It has also been discovered that the interposer assembly 1202, including the wide pillar 1204 and the molded body 106, can be fabricated as a single discrete structure instead of being formed piece by piece on the base assembly 104. The wide pillar 1204 can be built-in when forming the interposer assembly 1202 as a single discrete structure. The single discrete unit construction of the interposer assembly 1202 increases yield and reduces manufacturing time because the interposer assembly 1202 can be quickly placed on any compatible bottom substrate, system, or package.

Further, it has been found that the wide pillar 1204 and the solder structure 120 replace the need for thermal compression bonding (TCB) and large solder balls when attaching the traces of the interposer to the traces of the base substrate 110. The wide pillar 1204 and the solder structure 120 increase the reliability of the electrical connection because the solder structure 120 is large enough to prevent misalignment problems with the interconnect during attachment. It has also been found that the wide pillar 1204 having a height equal to or over 400 µm provides a high profile interposer for mounting more components underneath the interposer assembly 1202 in a package.

Figure 13:
FIG. 13 is the integrated circuit packaging system of FIG. 12 in a carrier-preparation phase of manufacture.

Referring now to FIG. 13, therein is shown the integrated circuit packaging system 1200 of FIG. 12 in a carrier-preparation phase of manufacture. The carrier 402 can be provided. The carrier 402 can include SPCC grade steel.

A wide hole 1302 can be formed into the carrier 402. The wide hole 1302 can be formed using laser ablation or mechanical drilling. The wide hole 1302 can be a blind hole or the hole 408 can be a through hole that passes completely through the carrier 402.

For illustrative purposes, the wide hole 1302 is shown as a blind hole, which does not pass completely through the carrier 402. The wide hole 1302 can include a range of 250 µm to 350 µm in diameter. It has been found that the wide hole 1302 can be made with consistent dimensions for forming uniform depth and width of the pillars in subsequent manufacturing steps.

Figure 14:
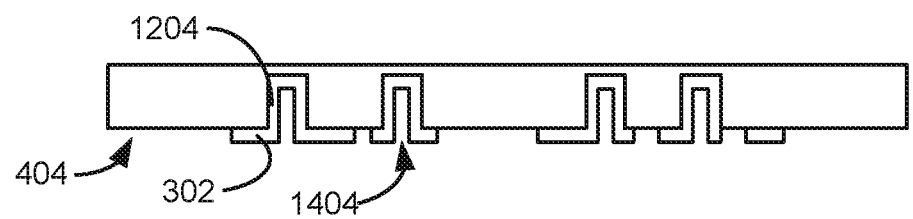
FIG. 14 is the structure of FIG. 13 in a first plating phase of manufacture.

Referring now to FIG. 14, therein is shown the structure of FIG. 13 in a first plating phase of manufacture. The first trace layer 302 and the wide pillar 1204 can be formed through a plating method. The wide pillar 1204 can be similar to the support pillar 108 of FIG. 1 except the wide pillar 1204 has a diameter greater than the support pillar 108. The wide pillar 1204 can include a diameter of 250 µm to 350 µm.

It has been found that the first trace layer 302 and the wide pillar 1204 can be formed on the carrier first side 404 in a single manufacturing step for reducing manufacturing steps and increasing yield. The first trace layer 302 and the wide pillar 1204 can be formed using a conductor formation process including chemical vapor deposition (CVD), a photo resist method, plating, sputtering, physical vapor deposition (PVD), electrolytic plating, and electroless plating processes as examples.

The plating within the wide hole 1302 of FIG. 13 forms the wide pillar 1204. The wide pillar 1204 can include a pillar cavity 1404. Because of the wider diameter of the wide pillar 1204, the first plating process does not completely fill in the wide hole 1302. The first trace layer 302 is formed on the carrier first side 404.

It has been discovered that the wide pillar 1204 having a diameter of 250-350 µm provides enough space for the wide pillar 1204 and the pillar cavity 1404 to be formed in a single deposition step. As such, the single deposition step reduces manufacturing steps and increases yield because the wide pillar 1204, the pillar cavity 1404, and the first trace layer 302 do not require individual manufacturing steps. The diameter of 250-350 µm also provides the benefit of increased surface area for interconnection, facilitation in interconnection alignment, and increased rigidity and structural stability for the pillar structures.

Figure 15:
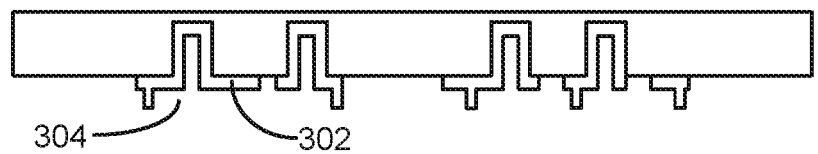
FIG. 15 is the structure of FIG. 14 in a via-formation phase of manufacture.

Referring now to FIG. 15, therein is shown the structure of FIG. 14 in a via-formation phase of manufacture. The via 304 can be formed on the first trace layer 302. The via 304 can extend vertically beyond the first trace layer 302.

The via 304 can be formed through a conductor formation process including chemical vapor deposition (CVD), a photo resist method, plating, sputtering, physical vapor deposition (PVD), electrolytic plating, and electroless plating processes as examples.

Figure 16:
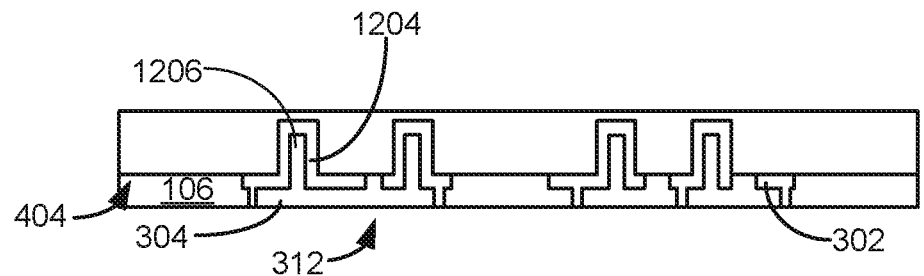
FIG. 16 is the structure of FIG. 15 in a molding phase of manufacture.

Referring now to FIG. 16, therein is shown the structure of FIG. 15 in a molding phase of manufacture. The molded body 106 can be formed over the carrier first side 404, the first trace layer 302, and the via 304. The encapsulation process can fill in the pillar cavity 1404 of FIG. 14 for forming the pillar core 1206.

The pillar core 1206 can be between the lateral sidewalls of the wide pillar 1204. The molding compound of the molded body 106 can be used to avoid pillar voids caused by the pillar cavity 1404. It has been found that the pillar core 1206 also provides additional rigidity and structural support for the wide pillar 1204. For example, the wide pillar 1204 with the pillar core 1206 can support increased bearing weight over the support pillar 108 of FIG. 1. The wide pillar 1204 having the pillar core 1206 is reinforced for preventing collapse and warping during attachment or top package mounting.

The molded body 106 can be formed using film-assist molding, carrier-assist molding, transfer molding, injection molding, or a combination thereof. The via 304 can be exposed from the body second side 312.

Figure 17:
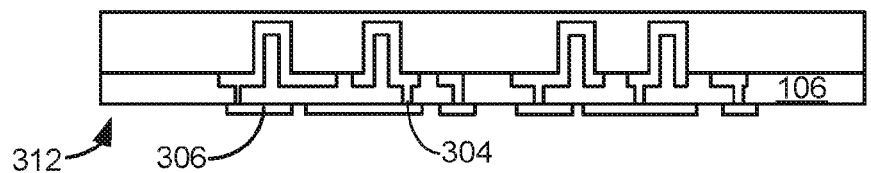
FIG. 17 is the structure of FIG. 16 in a second plating phase of manufacture.

Referring now to FIG. 17, therein is shown the structure of FIG. 16 in a second plating phase of manufacture. The second trace layer 306 can be formed on the body second side 312 of the molded body 106. The second trace layer 306 is in direct contact with a portion of the via 304 exposed from the molded body 106.

The second trace layer 306 can be formed by a using a conductor formation process including chemical vapor deposition (CVD), a photo resist method, plating, sputtering, physical vapor deposition (PVD), electrolytic plating, and electroless plating processes as examples. The second trace layer 306 is in direct contact with and coplanar with the body second side 312 of the molded body 106.

Figure 18:
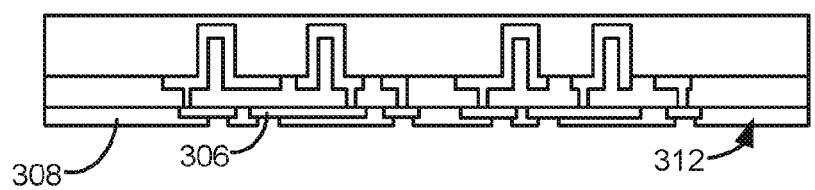
FIG. 18 is the structure of FIG. 17 in a mask-formation phase of manufacture.

Referring now to FIG. 18, therein is shown the structure of FIG. 17 in a mask-formation phase of manufacture. The solder mask layer 308 is formed over the body second side 312 and the second trace layer 306. It has been found that the second trace layer 306 forms bond pads through openings in the solder mask layer 308.

Figure 19:
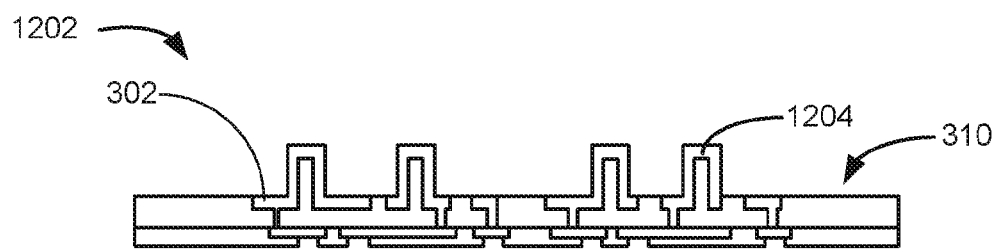
FIG. 19 is the structure of FIG. 18 in a carrier-removal phase of manufacture.

Referring now to FIG. 19, therein is shown the structure of FIG. 18 in a carrier-removal phase of manufacture. An etching method, such as chemical etching, can be used to remove the carrier 402 of FIG. 13. The removal of the carrier 402 forms the interposer assembly 1202 as a discrete structure that can be mounted on other components.

The etching method exposes the wide pillar 1204 from the carrier 402, which allows the wide pillar 1204 to be mounted on other components, assemblies, substrates, or systems. The etching method also partially exposes the first trace layer 302 and the body first side 310.

Figure 20:
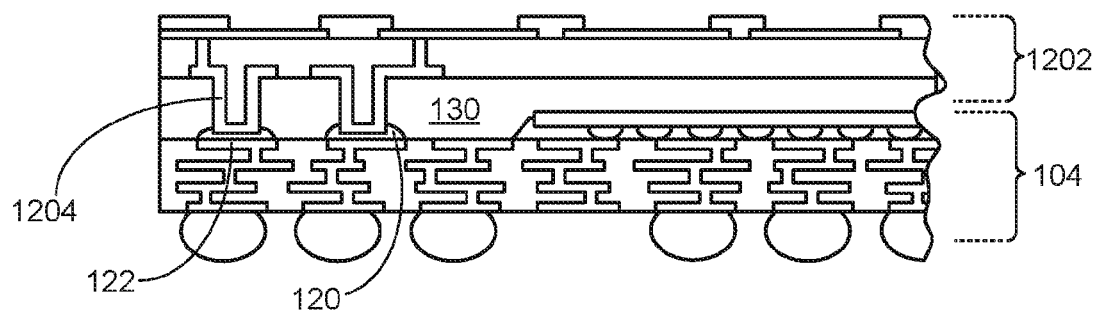
FIG. 20 is a partial view of the interposer assembly of FIG. 12 mounted to the base assembly.

Referring now to FIG. 20, therein is shown a partial view of the interposer assembly 1202 of FIG. 12 mounted to the base assembly 104. The interposer assembly 1202 can be attached to the base assembly 104.

The wide pillar 1204 can be connected and aligned to the interconnection pads 122 by the solder structure 120. Transfer or injection molding can be used to form the base encapsulation 130 between the interposer assembly 102 and the base substrate 110.

Figure 21:
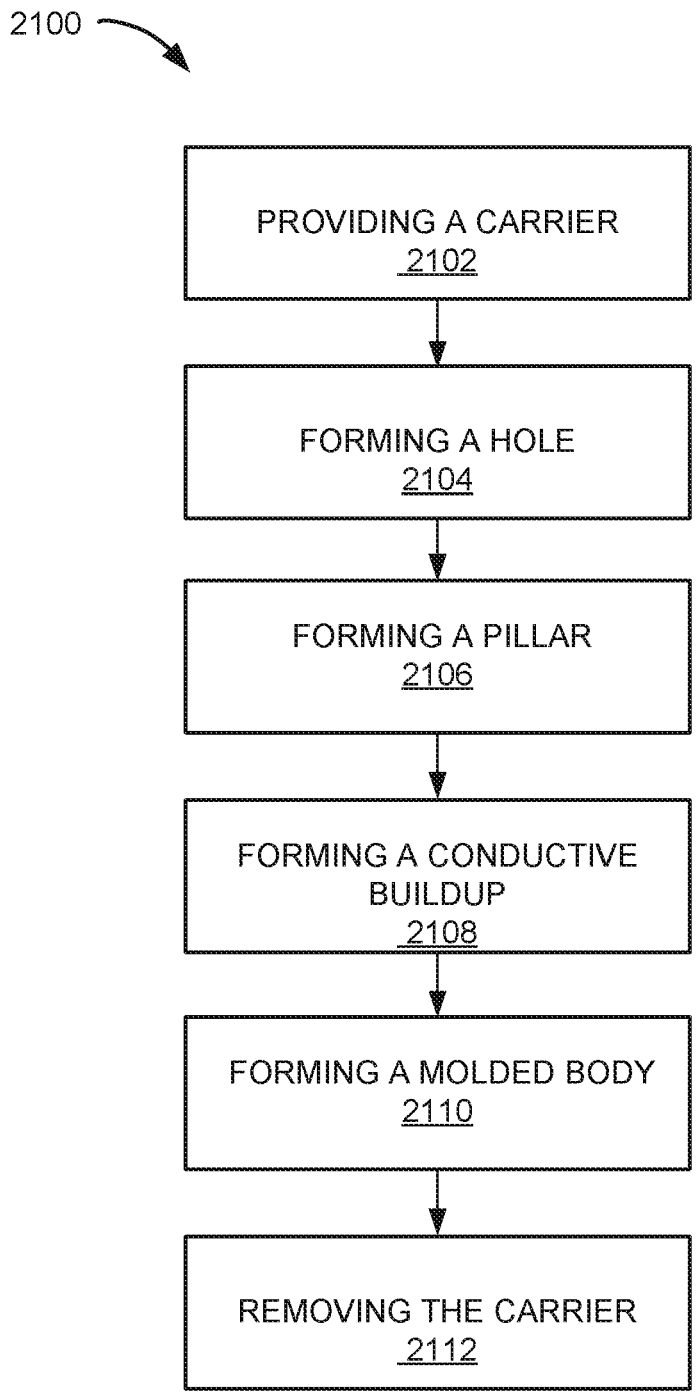
FIG. 21 is a flow chart of a method of manufacture of the integrated circuit packaging system in a further embodiment of the present invention.

Referring now to FIG. 21, therein is shown a flow chart of a method 2100 of manufacture of the integrated circuit packaging system 100 in a further embodiment of the present invention. The method 2100 includes: providing a carrier in a block 2102; forming a hole into the carrier in a block 2104; forming a pillar in the hole of the carrier in a block 2106; forming a conductive buildup over the pillar in a block 2108; forming a molded body over the carrier and the support pillar, the molded body for encapsulating the conductive buildup in a block 2110; and removing the carrier for exposing the pillar in a block 2112.

Thus, it has been discovered that the integrated circuit packaging system of the present invention furnishes important and heretofore unknown and unavailable solutions, capabilities, and functional aspects for interposer systems on integrated circuit packaging systems. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a first trace layer having a pillar extending perpendicularly away from a first trace layer;
    a via directly on the first trace layer, the via extending away from the first trace layer on a side opposite from the pillar;
    a conductive buildup having the first trace layer and a second trace layer electrically connected by the via; and
    a molded body partially encapsulating the first trace layer and the via of the conductive buildup, the first trace layer coplanar with a body first side of the molded body, the pillar extending out of the body first side of the molded body, and the second trace layer over and coplanar with a body second side of the molded body.

2. The system as claimed in claim 1 further comprising a solder mask layer over the conductive buildup, a portion of the conductive buildup exposed from the solder mask layer.

3. The system as claimed in claim 1 wherein the conductive buildup includes:
    the second trace layer over the via, the second trace layer directly on the molded body, and the via between the first trace layer and the second trace layer.

4. The system as claimed in claim 1 wherein the pillar includes a diameter of 50 µm to 300 µm.

5. The system as claimed in claim 1 wherein the pillar includes a pillar core in a pillar cavity of the pillar.

6. The system as claimed in claim 1 further comprising a base assembly attached to the pillar, the molded body over the base assembly.

7. The system as claimed in claim 1 further comprising;
    a solder structure on a component side of a base assembly; and
    wherein the pillar is attached to the solder structure.

8. The system as claimed in claim 1 wherein the pillar includes a height over 400 µm.

9. The system as claimed in claim 1 further comprising:
    a base substrate attached to the pillar; and
    an integrated circuit device over the base substrate.

10. The system as claimed in claim 1 further comprising a base assembly attached to the pillar; and
    a base encapsulation between the molded body and the base assembly.

11. An integrated circuit packaging system comprising:
    a first trace having a wide pillar extending perpendicularly away from a first trace layer, the wide pillar having a diameter of 250 µm to 350 µm;
    a via directly on the first trace layer, the via extending away from the first trace layer on a side opposite from the wide pillar;
    a conductive buildup having the first trace layer and a second trace layer electrically connected by the via; and
    a molded body partially encapsulating the first trace layer and the via of the conductive buildup, the first trace layer coplanar with a body first side of the molded boy, the wide pillar extending out of the body first side, and the second trace layer over and coplanar with a body second side of the molded body.

12. The system as claimed in claim 11 further comprising a pillar core in a pillar cavity of the wide pillar.

13. The system as claimed in claim 11 further comprising:
    a base assembly;
    a solder structure on a component side of the base assembly; and wherein the wide pillar is attached to the solder structure.

14. The system as claimed in claim 11 further comprising:
a base substrate attached to the wide pillar;
an integrated circuit device over the base substrate; and
an underfill between the base substrate and the integrated circuit device.

\* \* \* \* \*